United States Patent
Cho et al.

(10) Patent No.: US 8,314,025 B2
(45) Date of Patent: Nov. 20, 2012

(54) METHOD OF FORMING SEMICONDUCTOR DEVICE HAVING CONTACT PLUG

(75) Inventors: Sung-Il Cho, Seoul (KR); Nam-Gun Kim, Seoul (KR); Jong-Cheol Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/793,843

(22) Filed: Jun. 4, 2010

(65) Prior Publication Data

US 2011/0183512 A1 Jul. 28, 2011

(30) Foreign Application Priority Data

Jan. 22, 2010 (KR) .................. 10-2010-0006018

(51) Int. Cl.
*H01L 21/00* (2006.01)

(52) U.S. Cl. ....................................... 438/629; 438/630

(58) Field of Classification Search .......... 438/253–256, 438/629–634
See application file for complete search history.

(56) References Cited

U.S. PATENT DOCUMENTS

| 5,744,394 A * | 4/1998 | Iguchi et al. ............. 438/276 |
| 5,773,314 A * | 6/1998 | Jiang et al. ............. 438/3 |
| 6,930,341 B2 | 8/2005 | Park et al. |
| 2007/0197021 A1 | 8/2007 | Nam et al. |

FOREIGN PATENT DOCUMENTS

| JP | 2004-072109 | 3/2004 |
| KR | 1020040009418 A | 1/2004 |
| KR | 1020040012367 A | 2/2004 |
| KR | 1020070085015 A | 8/2007 |
| KR | 1020090001137 A | 1/2009 |

* cited by examiner

Primary Examiner — Richard A. Booth
(74) Attorney, Agent, or Firm — Volentine & Whitt, PLLC

(57) ABSTRACT

A method of forming a semiconductor device includes forming a lower conductive pattern on a substrate, forming an insulating layer over the lower conductive pattern, forming a contact hole through the insulating layer to expose the lower conductive pattern, forming a first spacer along sides of the contact hole, and then forming a contact plug in the contact hole. The contact plug is formed so as to contact the lower conductive pattern.

18 Claims, 9 Drawing Sheets

METHOD OF FORMING SEMICONDUCTOR DEVICE HAVING CONTACT PLUG

PRIORITY STATEMENT

This application claims the benefit of priority under 35 U.S.C. §119 from Korean Patent Application No. 10-2010-0006018, filed on Jan. 22, 2010.

BACKGROUND

1. Field

The inventive concept relates to semiconductor devices and the like. More particularly, the inventive concept relates to a method of forming a buried contact plug of semiconductor and like devices.

2. Description of Related Art

If semiconductor devices are to become more highly integrated, the aspect ratio of the contact plugs of such devices must be increased. For example, in a memory device such as a dynamic random access memory (DRAM), buried contact plugs are interposed between bit lines. If the spacing of the bit lines is decreased to increase the integration density of the DRAM, the aspect ratio of the buried contact plugs must be increased. However, the electrical characteristics required of a contact plug impose limits on the aspect ratio which can be attained using conventional manufacturing techniques.

SUMMARY

According to one aspect of the inventive concept, there is provided a method of forming a semiconductor device in which a lower conductive pattern is formed on a substrate, the lower conductive pattern is covered with an upper portion of electrical insulating material, a contact hole is formed through the insulating material at such a location as to expose the lower conductive pattern, a first contact spacer of electrical insulating material is then formed on sides of the contact hole, and a contact plug is formed in the contact hole. The contact plug so formed is electrically connected to the lower conductive pattern.

According to another aspect of the inventive concept, there is provided a method of forming a semiconductor device in which a lower conductive pattern is formed on a substrate, the lower conductive pattern is covered with an upper portion of electrical insulating material, a contact hole is formed through the insulating material at such a location as to expose the lower conductive pattern, a sacrificial pattern is formed to occupy the bottom of the contact hole and cover the lower conductive pattern, a contact spacer of electrical insulating material is formed along sides of the contact hole whose bottom is occupied by the sacrificial pattern, the sacrificial pattern is then removed to once again expose the lower conductive pattern, and a contact plug is then formed in the contact hole. According to this aspect as well, the contact plug so formed is electrically connected to the lower conductive pattern.

According to still another aspect of the inventive concept, there is provided a method of forming a semiconductor device in which a lower conductive pattern is formed on a substrate, the lower conductive pattern is covered with an upper portion of electrical insulating material, a contact hole is formed through the insulating material at such a location as to expose the lower conductive pattern, a plug pattern is formed to occupy the bottom of the contact hole and cover the lower conductive pattern, a spacer of electrical insulating material is formed along sides of the contact hole whose bottom is occupied by the plug pattern, and a plug is formed on the plug pattern.

BRIEF DESCRIPTION OF THE DRAWINGS

Preferred embodiments of the inventive concept will now be described more fully with reference to the accompanying drawings. Like reference numbers designate like elements throughout the drawings. Also, in the drawings, the thicknesses of layers and regions may be exaggerated for clarity. In particular, the cross-sectional illustrations of the semiconductor devices and intermediate structures fabricated during the course of their manufacture are schematic.

Furthermore, spatially relative terms, such as "beneath," "below," "lower," "above," "upper" and the like are used to describe an element's and/or feature's relationship to another element(s) and/or feature(s) as illustrated in the figures. Obviously, though, all such spatially relative terms are not necessarily limiting.

DETAILED DESCRIPTION OF THE PREFERRED EMBODIMENTS

Figure 1:
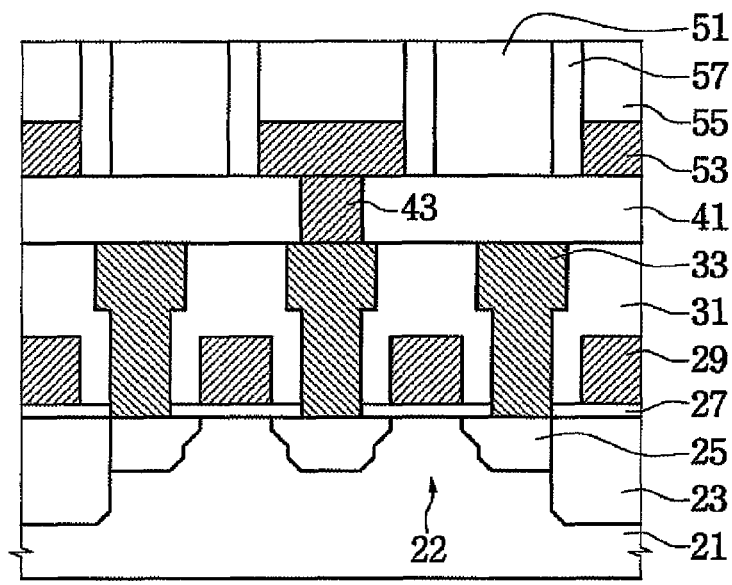
FIGS. 1 through 7 are cross-sectional views illustrating a method of forming a semiconductor device having a contact plug, in accordance with the inventive concept.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

A first example of a method of forming a semiconductor device having a contact plug in accordance with the inventive concept will now be described with reference to FIGS. 1-7.

Referring first to FIG. 1, an isolation layer 23 is formed on a predetermined region of a substrate 21 to define an active region 22. A gate dielectric layer 27 and gate electrodes 29 are formed on the substrate 21. Source and drain regions 25 are formed on the active region 22 adjacent to both sides of each of the gate electrodes 29. Next, a lower insulating layer 31 is formed over the gate electrodes 29. Vias 33 are then formed in the lower insulating layer 31 in alignment with the source and drain regions 25, respectively. The vias 33 have pads at their upper parts, extend through the lower insulating layer 31 and are connected to the source and drain regions 25, respectively. An interlayer insulating layer 41 is then formed on the lower insulating layer 31. A bit plug 43 is then formed in the interlayer insulating layer 41 as extending therethrough and connected to a respective one of the vias 33. Then, an upper insulating layer 51, bit lines 53, a bit capping pattern 55 and bit spacers 57 are formed on the interlayer insulating layer 41.

The substrate 21 may be a semiconductor substrate such as a silicon wafer or a silicon-on-insulator (SOI) wafer. The isolation layer 23 may be formed using shallow trench isolation (STI). The isolation layer 23 is formed of insulating material such as silicon oxide, silicon nitride, silicon oxynitride, or a combination of respective ones of such materials.

The gate electrodes 29 may cross the active region 22 and extend onto the isolation layer 23. Each gate electrodes 29 may constitute a portion of a respective word line. The gate electrodes 29 themselves may be parallel to each other. The gate electrodes 29 may be formed of polysilicon, a metal, a metal silicide, or a combination of respective layers of such materials (hereinafter, the term respective "ones" of such materials will be used to generally refer to layers of material formed generally as stacked one atop the other).

The gate dielectric layer 27 is interposed between the gate electrodes 29 and the active region 22. The gate dielectric layer 27 may be formed of silicon oxide, silicon nitride, silicon oxynitride, a high-k dielectric, or a combination of respective ones of such materials.

The lower insulating layer 31 is formed of insulating material such as silicon oxide, silicon nitride, silicon oxynitride, or a combination of respective ones of such materials. The vias 33 may be formed of polysilicon, a metal, a metal silicide, or a combination of respective ones of such materials. The lower insulating layer 31 and the vias 33 have flat upper surfaces. In this case, the upper surfaces of the lower insulating layer 31 and the vias 33 are substantially coplanar. In addition, the vias 33 may be self-aligned between the gate electrodes 29. In this embodiment, the vias 33 constitute a lower conductive pattern.

The interlayer insulating layer 41 is formed of insulating material such as silicon oxide, silicon nitride, silicon oxynitride, or a combination of respective ones of such materials. The interlayer insulating layer 41 covers the lower insulating layer 31 and the vias 33. An etch stop layer, which is conventional per se, may be formed between the lower insulating layer 31 and the interlayer insulating layer 41. The bit plug 43 may be formed of polysilicon, a metal layer, a metal silicide, or a combination thereof. The interlayer insulating layer 41 and the bit plug 43 may have flat upper surfaces. In this case, the upper surfaces of the interlayer insulating layer 41 and the bit plug 43 may be substantially coplanar.

The bit lines 53 are disposed parallel to each other on the interlayer insulating layer 41. The bit plug 43 contacts a respective one of the bit lines 53. The bit lines 53 may be formed of a metal, a metal silicide, or a combination thereof. The bit lines 53 constitute an upper conductive pattern. The bit capping pattern 55 covers upper surfaces of the bit lines 53. The bit capping pattern 55 is formed of insulating material such as a silicon oxide, silicon nitride, silicon oxynitride layer, or a combination of respective ones of such materials. The bit spacers 57 cover sidewalls of the bit capping pattern 55 and the bit lines 53. The bit spacers 57 are also formed of insulating material such as silicon oxide, silicon nitride, silicon oxynitride layer, or a combination of respective ones of such materials. Preferably, the bit spacers 57 and the bit capping pattern 55 are of material having an etch selectivity with respect to the upper insulating layer 51 and the interlayer insulating layer 41.

The upper insulating layer 51 fills the gaps between the bit lines 53 and covers the interlayer insulating layer 41. The upper insulating layer 51 is formed of an insulating material such as silicon oxide layer, silicon nitride, silicon oxynitride, or a combination of respective ones of such materials. The upper insulating layer 51 and the bit capping pattern 55 may have flat upper surfaces. In this case, the upper surfaces of the upper insulating layer 51 and the bit capping pattern 55 are substantially coplanar. Alternatively, the upper insulating layer 51 may cover the bit capping pattern 55, the bit spacers 57 and the bit lines 53. An etch stop layer, conventional per se, may be formed between the upper insulating layer 51 and the interlayer insulating layer 41.

Figure 2:
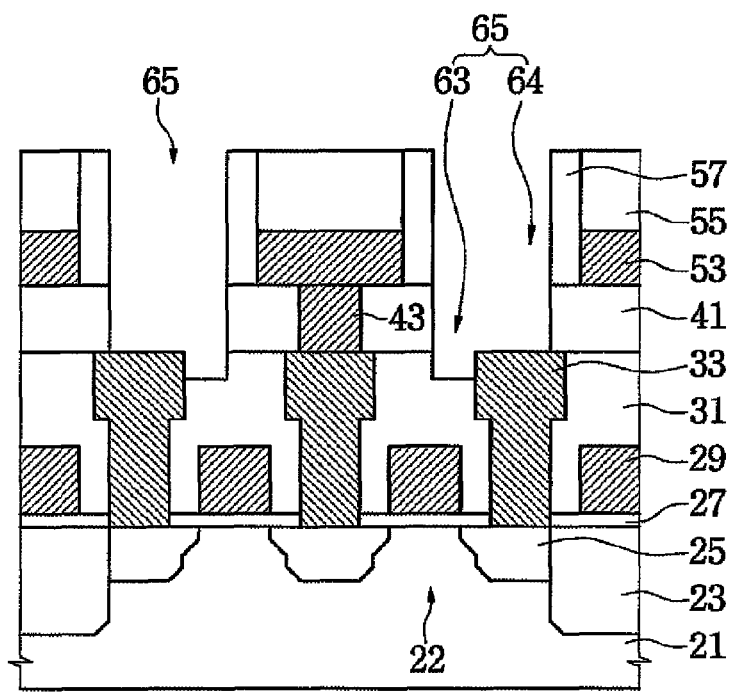

Referring to FIG. 2, the upper insulating layer 51 and the interlayer insulating layer 41 are patterned to form buried contact holes 65. Each of the buried contact holes 65 has an upper section 64 passing through the upper insulating layer 51, and a lower section 63 passing through the interlayer insulating layer 41. The buried contact holes 65 may be formed such that the bottoms thereof are located at a level beneath the upper surfaces of the vias 33 and the lower insulating layer 31.

Furthermore, the buried contact holes 65 are self-aligned between the bit spacers 57 in the case in which the bit spacers 57 and the bit capping pattern 55 have an etch selectivity with respect to the upper insulating layer 51 and the interlayer insulating layer 41. That is, the buried contact holes 65 may be self-aligned between the bit lines 53. In addition, the bit spacers 57 are exposed in the upper sections 64 of the buried contact holes 65.

On the other hand, respective ones of the vias 33 are exposed at bottoms of the buried contact holes 65. As shown in the figure, the buried contact holes 65 may be misaligned with the upper surfaces of the vias 33. That is, a line extending through the center of the buried contact hole 65 and perpendicular to the substrate 21 may be spaced from a line extending through the center of the via 33 and perpendicular to the substrate 21. In this case, the lower contact hole 63 extends in the lower insulating layer 31. That is, respective ones of the vias 33 and the lower insulating layer 31 may be exposed at bottoms of the buried contact holes 65. In addition, portions of the sidewalls of the vias 33 are exposed by the buried contact holes 65.

Figure 3:
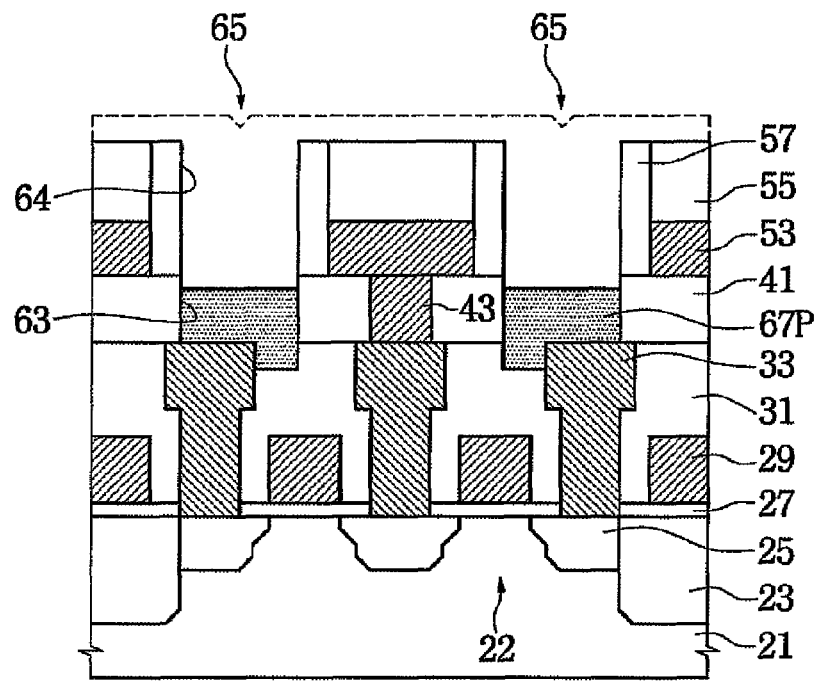

Referring to FIG. 3, a plug pattern 67P is formed. The plug pattern 67P fills part of the buried contact holes 65. The plug pattern 67P may be formed by forming a plug layer that fills the buried contact holes 65 and covers the substrate 21, and then etching back the plug layer. Preferably, the plug pattern 67P fills only part of the lower sections 63 of the buried contact holes 65, i.e., the upper surface of the plug pattern 67P is disposed at a level beneath that of the bottom surfaces of the bit lines 53. As a result, the interlayer insulating layer 41, the bit spacers 57 and the upper insulating layer 51 are exposed on the plug pattern 67P in the buried contact holes 65.

The plug pattern 67P may be of material having an etch selectivity with respect to the bit spacers 57, the upper insulating layer 51, the interlayer insulating layer 41, the vias 33, and the lower insulating layer 31. For example, the plug pattern 67P may be formed of a carbon spin on organic hardmask (C—SOH). In this case, the plug pattern 67P functions as a sacrificial layer. Alternatively, the plug pattern 67P may be formed of an organic material, SiGe, Si, AlN, and/or a metal.

Figure 4:
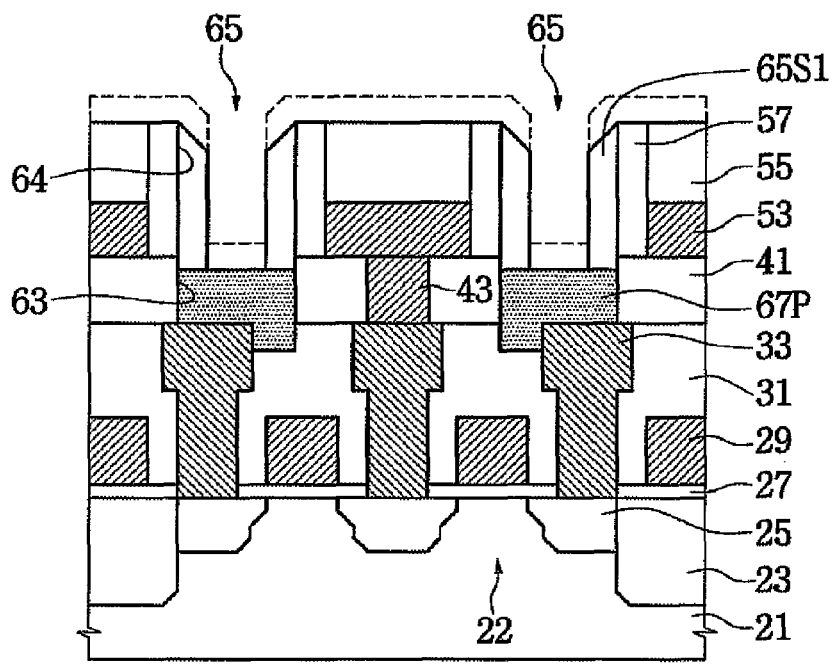

Referring to FIG. 4, contact spacers 65S1 are formed along the sides of the buried contact holes 65. In this respect, the contact spacers 65S1 may be formed by covering the substrate 21 conformally with a spacer layer, and then anisotropically etching the spacer layer until the plug pattern 67P is exposed. As a result, the contact spacers 65S1 are formed along the sides of the upper sections 64 of the buried contact holes 65. That is, the contact spacers 65S1 cover the bit spacers 57 and the interlayer insulating layer 41. Furthermore, the contact spacers 65S1 contact the upper surface of the plug pattern 67P. Thus, the bottoms of the contact spacers 65S1 are disposed at a level beneath that of the bottoms of the bit lines 53.

The contact spacers 65S1 are formed of an insulating material such as silicon oxide, silicon nitride, silicon oxynitride, or a combination thereof. In any case, the contact spacers 65S1 are preferably formed of a material layer having an etch selectivity with respect to the plug pattern 67P. In other words, the plug pattern 67P may be formed of a material layer having an etch selectivity with respect to the contact spacers 65S1, the upper insulating layer 51, the interlayer insulating layer 41, the landing pads 33, and the lower insulating layer 31.

Figure 5:
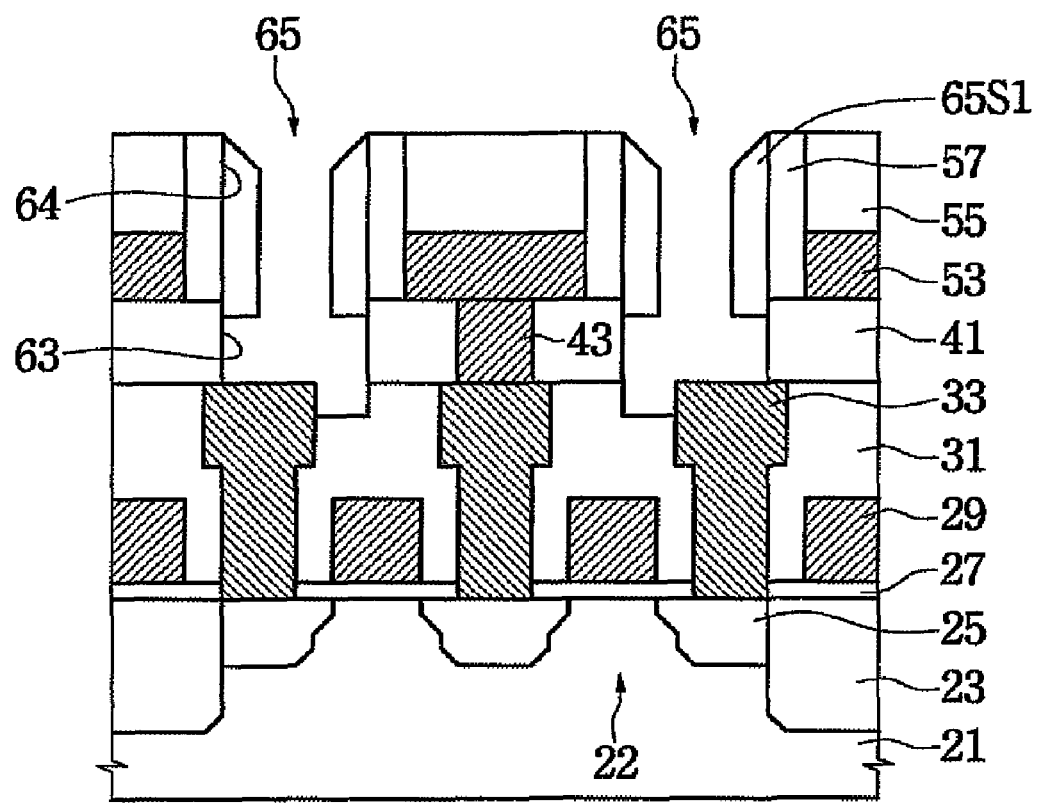

Referring to FIG. 5, the plug pattern 67P is removed to expose the pads of the vias 33. The plug pattern 67P may be removed by an anisotropic etching process. As a result, the contact spacers 65S1 remain in upper regions of the buried contact holes 65. That is, the contact spacers 65S1 may remain in the upper sections 64 of the buried contact holes 65. Also, as is shown, the contact spacers 65S1 extend over the sidewalls of the bit lines 53.

Figure 6:
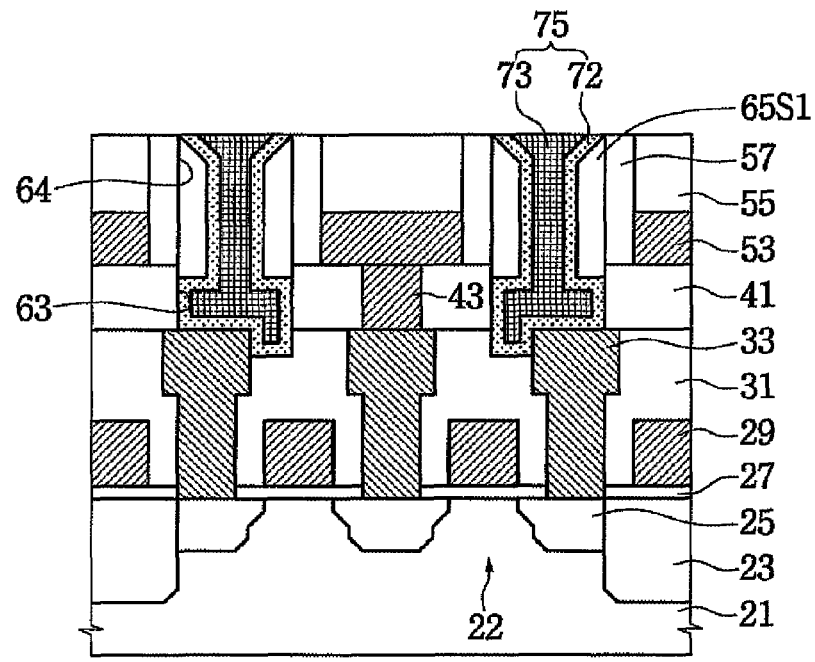

Referring to FIG. 6, buried contact plugs 75 are formed using thin film forming processes and a planarization process, for example, to fill the buried contact holes 65. More specifically, the thin film forming processes may sequentially form a barrier metal layer 72 and a metal layer 73. The barrier metal layer 72 may be of material selected from the group consisting of Ti, TiN, and a combination thereof. The metal layer 73 may be of material selected from the group consisting of W, WN, Ti, TiN, Ta, TaN, AlN, TiAlN, TaAlN, Cu, and a combination of respective materials thereof.

As a result, the buried contact plugs 75 contact the pads of the vias 33. Furthermore, the buried contact plugs 75 are self-aligned between the bit lines 53. However, the buried contact plugs 75 may be misaligned with the vias 33. That is, a line extending through the center of a buried contact plug 75 and perpendicular to the substrate 21 may be spaced from a line extending through the center of the underlying via 33 and perpendicular to the substrate 21. Accordingly, the buried contact plugs 75 may extend in the lower insulating layer 31. In this case, the bottoms of the buried contact plugs 75 may be located at a level beneath that of the upper surfaces of the vias 33 and the upper surface of the lower insulating layer 31. In other wards, as shown in the figure, part of each of the buried contact plugs 75 may contact the upper surface and the sidewall of a respective one of the vias 33.

Figure 7:
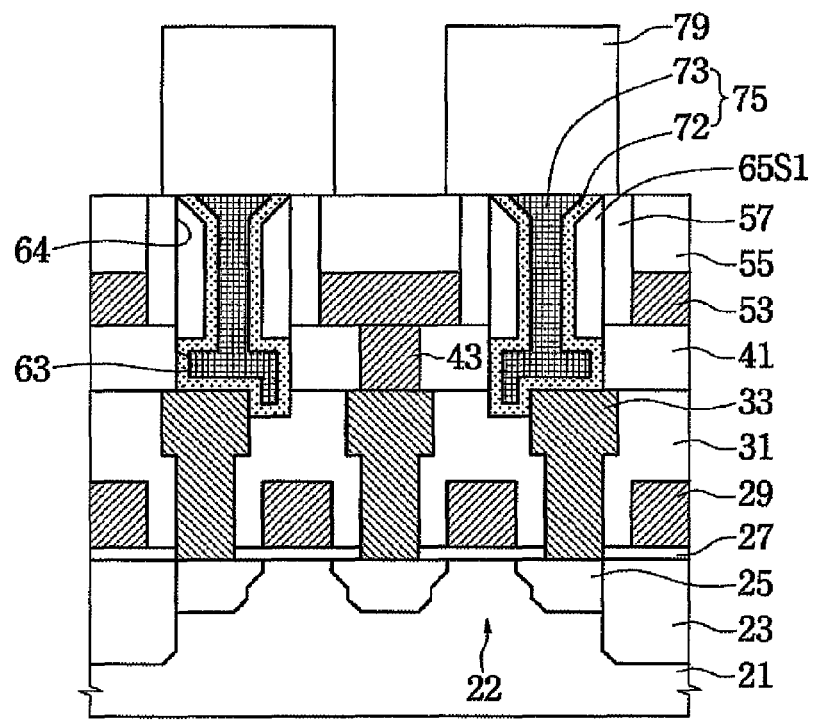

Referring to FIG. 7, lower capacitor electrodes 79 are formed on the buried contact plugs 75, respectively. The lower capacitor electrodes 79 are thus electrically connected to the source and drain regions 25 via the buried contact plugs 75 and the vias 33. The lower capacitor electrodes 79 may each constitute a portion of a data storage element.

According to this embodiment of the inventive concept, contact spacers 65S1 and bit spacers 57 are interposed between each buried contact plug 75 and the adjacent bit lines 53. Therefore, the buried contact plugs 75 and the bit lines 53 are remarkably well insulated from one another. In addition, the buried contact plugs 75 have relatively large widths at the bottoms thereof, i.e., at the portions thereof beneath the contact spacers 65S1. More specifically, the portions of the buried contact plugs 75 located within the lower sections 63 of the buried contact holes 65 are wider than the portions of the buried contact plugs 75 located within the upper sections 64 of the buried contact holes 65. Thus, contact resistance between the buried contact plugs 75 and the vias 33 is minimized while allowing for a minimal spacing between the bit lines 53.

Figure 8:
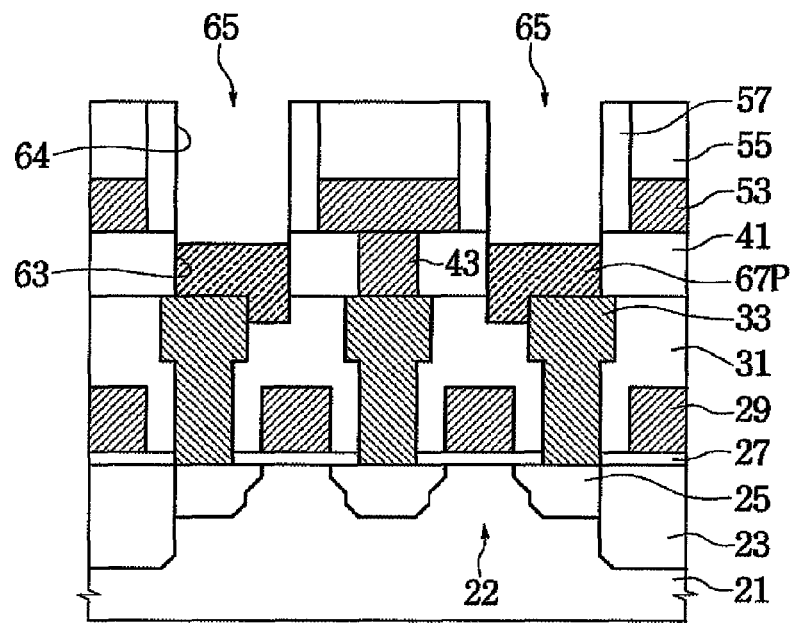
FIGS. 8 and 9 are cross-sectional views illustrating essential steps in another example of the method of forming a semiconductor device having a contact plug, in accordance with the inventive concept.
Figure 9:
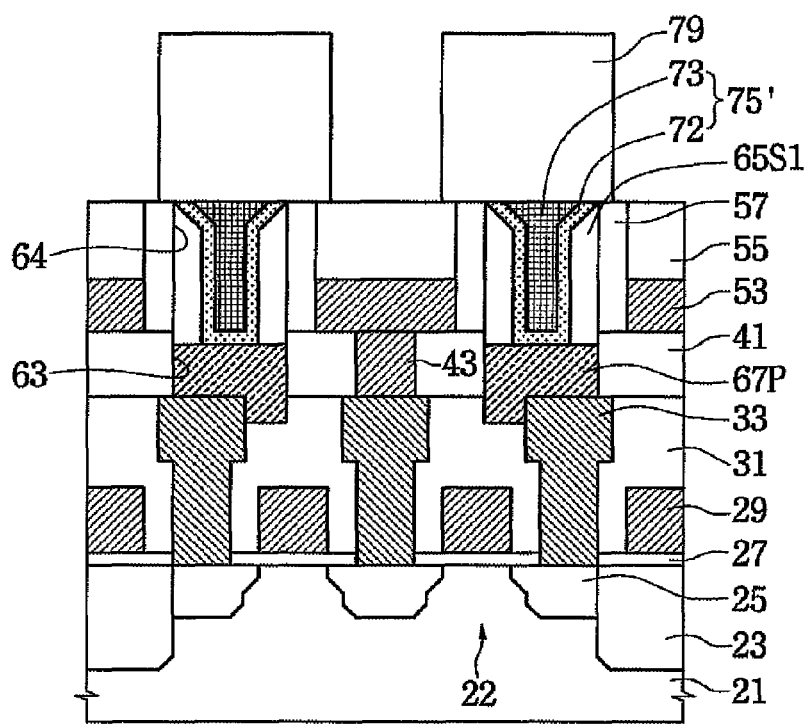

FIGS. 8 and 9 show essential steps in a variation of the method of forming a semiconductor device in accordance with the inventive concept.

Referring to FIG. 8, an intermediate product is produced using essentially the same steps described with respect to FIGS. 1-3. In this example, like that of the embodiment of FIGS. 1-7, a plug pattern 67P is formed to partially fill the buried contact holes 65. Briefly, the plug pattern 67P fills only part of the lower sections 63 of the buried contact holes 65. Thus, the upper surface of the plug pattern 67P is located at a level beneath that of the bottoms of the bit lines 53. As a result, the interlayer insulating layer 41 and the bit spacers 57 are exposed in the buried contact holes 65. Preferably, the plug pattern 67P is of material having an etch selectivity with respect to the bit spacers 57, the upper insulating layer 51, the interlayer insulating layer 41, the vias 33, and the lower insulating layer 31. In this respect, the plug pattern 67P may be formed of material selected from the group consisting of an organic material, SiGe, AlN, a metal silicide, a metal, and a combination of respective ones of such materials. In all other respect, the plug pattern 67P may be formed like that shown in and described with reference to FIG. 3.

Referring to FIG. 9, contact spacers 65S1 are formed at the sides of the buried contact holes 65. The contact spacers 65S1 may be formed by forming a conformal layer of insulating material over the substrate 21, and then anisotropically etching the layer until the plug pattern 67P is exposed. As a result, the contact spacers 65S1 extend over the sides of the bit spacers 57 and an upper part of the inner side surfaces the interlayer insulating layer 41. As another result, the bottoms of the contact spacers 65S1 are located at a level beneath that of the bottoms of the bit lines 53. Furthermore, the contact spacers 65S1 contact the upper surface of the plug pattern 67P.

Preferably, the contact spacers 65S1 are of material having an etch selectivity with respect to the plug pattern 67P. For instance, the contact spacers 65S1 are of insulating material such as a silicon oxide, silicon nitride, silicon oxynitride layer, or a combination of respective ones of such materials.

Upper plugs 75' are then formed on the plug pattern 67P to fill the buried contact holes 65. In this respect, the upper plugs 75' may be formed by sequentially depositing a barrier metal to form a barrier metal layer 72 and a metal to form a metal layer 73. The upper plugs 75' and the plug pattern 67P may constitute buried contact plugs.

Lower capacitor electrodes 79 may then be formed on the upper plugs 75'. In this case, the lower capacitor electrodes 79 are electrically connected to the source and drain electrodes 25 via the upper plugs 75', the plug pattern 67P and the vias 33.

According to this example, the upper plugs 75' are self-aligned between the bit lines 53. In addition, the upper plugs 75' are self-aligned with (the discrete plugs of) the plug pattern 67P. Furthermore, the discrete plugs of the plug pattern 67P are wider than the upper plugs 75'. Thus, the contact width between the upper plugs 75' and the discrete plugs of the plug pattern 67P are smaller than the widths of the discrete plugs of the plug pattern 67P.

Figure 10:
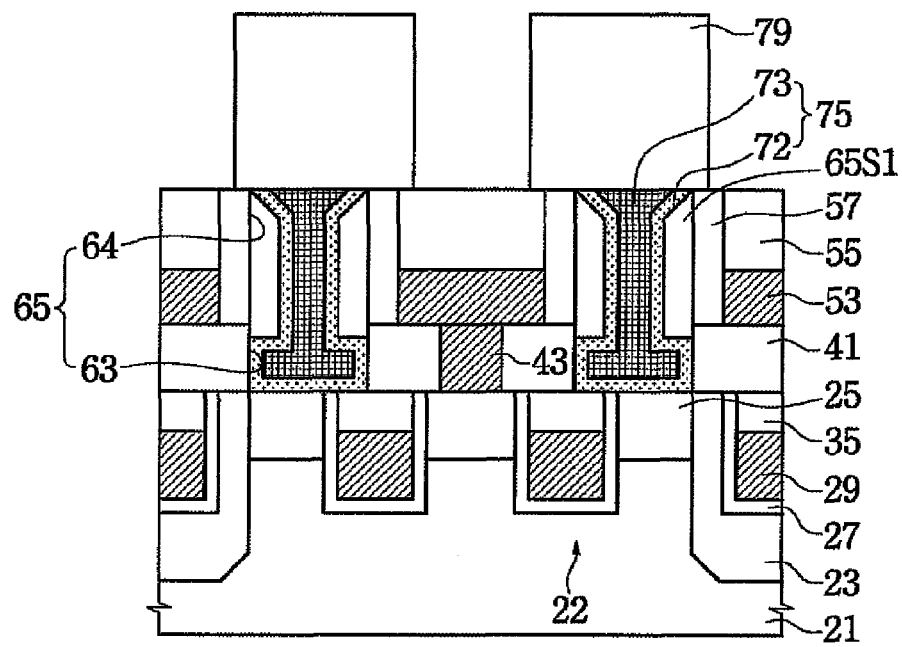
FIG. 10 is a cross-sectional view of another example of a semiconductor device having a contact plug, formed in accordance with an example of the inventive concept.

FIG. 10 is a cross-sectional view of a semiconductor device having a contact plug and formed in accordance with another example of the inventive concept.

Referring to FIG. 10, an active region 22, an isolation layer 23, a gate dielectric layer 27, gate electrodes 29, a gate capping pattern 35, source and drain regions 25, an interlayer insulating layer 41, a bit plug 43, an upper insulating layer 51, bit lines 53, a bit capping pattern 55, bit spacers 57, and buried contact holes 65 are formed on a substrate 21. Each of the buried contact holes 65 has an upper section 64 and a lower section 63.

In this example, the gate electrodes 29 are formed in the substrate 21, i.e., such that the upper surfaces of the gate electrodes are disposed at level beneath that of the upper surface of the substrate 21. The gate capping pattern 35 covers the gate electrodes 29. The gate capping pattern 35 is formed of insulating material such as silicon oxide, silicon nitride, silicon oxynitride layer, or a combination of respective ones of such materials. The bit plug 43 contacts one of the source and drain regions 25. Others of the source and drain regions 25 are exposed at the bottoms of the buried contact holes 65.

Next, a contact plug pattern (similar to the plug pattern 67P in FIG. 3) is formed. Then, contact spacers 65S1 are formed and the contact plug pattern is removed in a manner similar to that shown in and described with reference to FIGS. 4 and 5.

Then, buried contact plugs 75, and lower capacitor electrodes 79 are formed in a manner similar to that shown in and described with reference to FIGS. 6 and 7. Accordingly, the buried contact plugs 75 contact source and drain regions 25, respectively, and the lower capacitor electrodes 79 are electrically connected to such source and drain regions 25 via the buried contact plugs 75.

Figure 11:
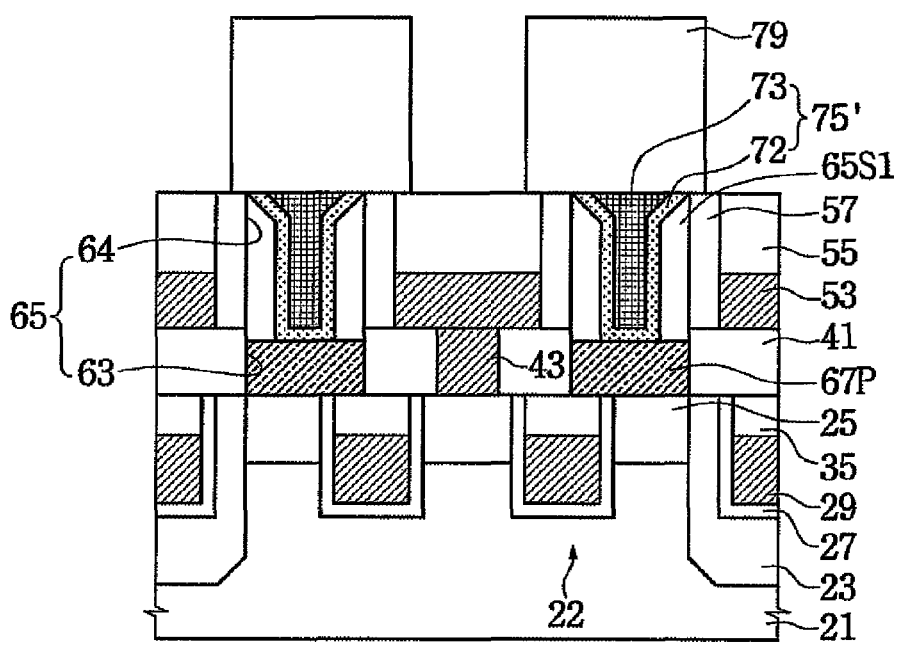
FIG. 11 is a cross-sectional view of still another semiconductor device having a contact plug, formed in accordance with an example of the inventive concept.

FIG. 11 illustrates another semiconductor device having a contact plug and formed in accordance with the inventive concept.

Referring to FIG. 11, an active region 22, an isolation layer 23, a gate dielectric layer 27, gate electrodes 29, a gate capping pattern 35, source and drain regions 25, an interlayer insulating layer 41, a bit plug 43, an upper insulating layer 51, bit lines 53, a bit capping pattern 55, bit spacers 57, and buried contact holes 65 are formed on a substrate 21. Each of the buried contact holes 65 has an upper section 64 and a lower section 63. In this example, like that shown in and described above with reference to FIG. 10, the gate electrodes 29 are formed in the substrate 21, and the gate capping pattern 35 covers the gate electrodes 29

A plug pattern 67P is formed in the buried contact holes 65 in a manner similar to that shown in and described with reference to FIG. 8. Thus, the upper surface of the plug pattern 67P is situated at a level beneath that of the bottoms of the bit lines 53.

Next, contact spacers 65S1, upper plugs 75', and lower capacitor electrodes 79 are formed in a manner similar to FIG. 9. Therefore, the upper plugs 75' contact the plug patterns 67P, the upper plugs 75' and the plug pattern 67P constitute buried contact plugs, and the lower capacitor electrodes 79 are electrically connected to the source and drain regions 25 via the upper plugs 75' and the plug pattern 67P.

Figure 12:
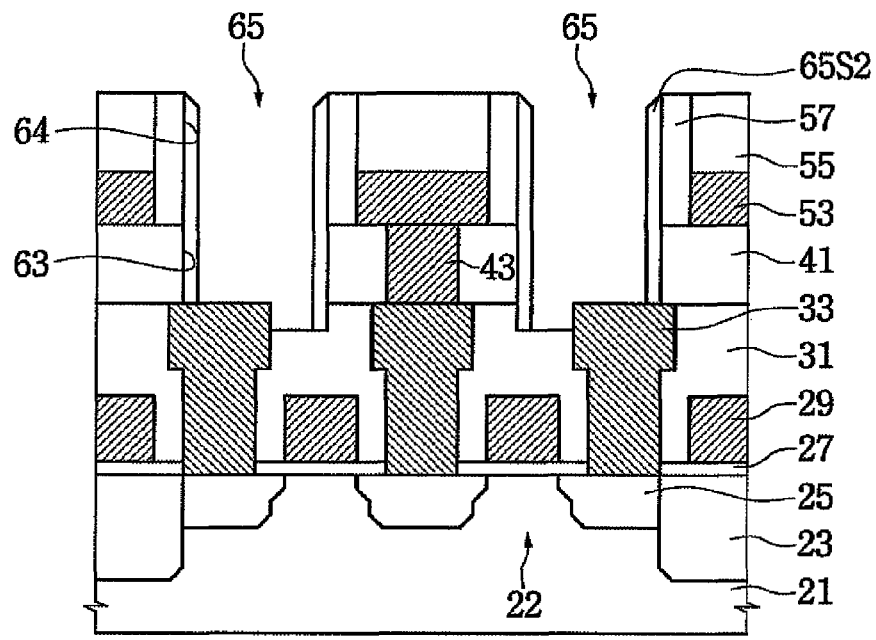
FIGS. 12 and 13 are cross-sectional views illustrating essential steps of still another example of a method of forming a semiconductor device having a contact plug, in accordance with the inventive concept.
Figure 13:
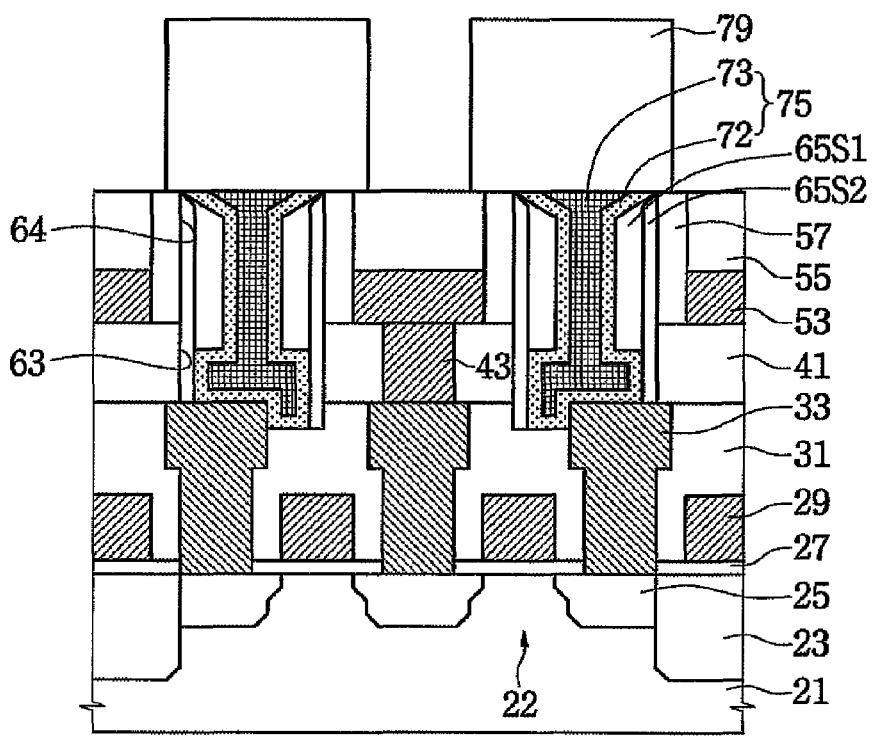

FIGS. 12 and 13 illustrate essential steps in another example of a method of forming a semiconductor device having a contact plug in accordance with the inventive concept.

Referring to FIG. 12, an active region 22, an isolation layer 23, a gate dielectric layer 27, gate electrodes 29, source and drain regions 25, a lower insulating layer 31, vias 33, an interlayer insulating layer 41, a bit plug 43, bit lines 53, a bit capping pattern 55, bit spacers 57, and buried contact holes 65 are formed on a substrate 21 in a manner similar to that shown in and described with reference to FIGS. 1 and 2. Each of the buried contact holes 65 has an upper section 64 and a lower section 63.

Also, first contact spacers 65S2 are formed along the sides of the buried contact holes 65. The first contact spacers 65S2 cover the bit spacers 57, the interlayer insulating layer 41, and the lower insulating layer 31. These first contact spacers 65S2 are formed of insulating material such as silicon oxide, silicon nitride, silicon oxynitride, or a combination of respective ones of such materials.

Referring to FIG. 13, second contact spacers 65S1, buried contact plugs 75, and lower capacitor electrodes 79 are formed in a manner similar to that shown in and described with reference to FIGS. 3 to 7. As a result, the buried contact plugs 75 contact the pads of the vias 33. Also, the lower capacitor electrodes 79 are electrically connected to the source and drain regions 25 via the buried contact plugs 75 and the vias 33.

Figure 14:
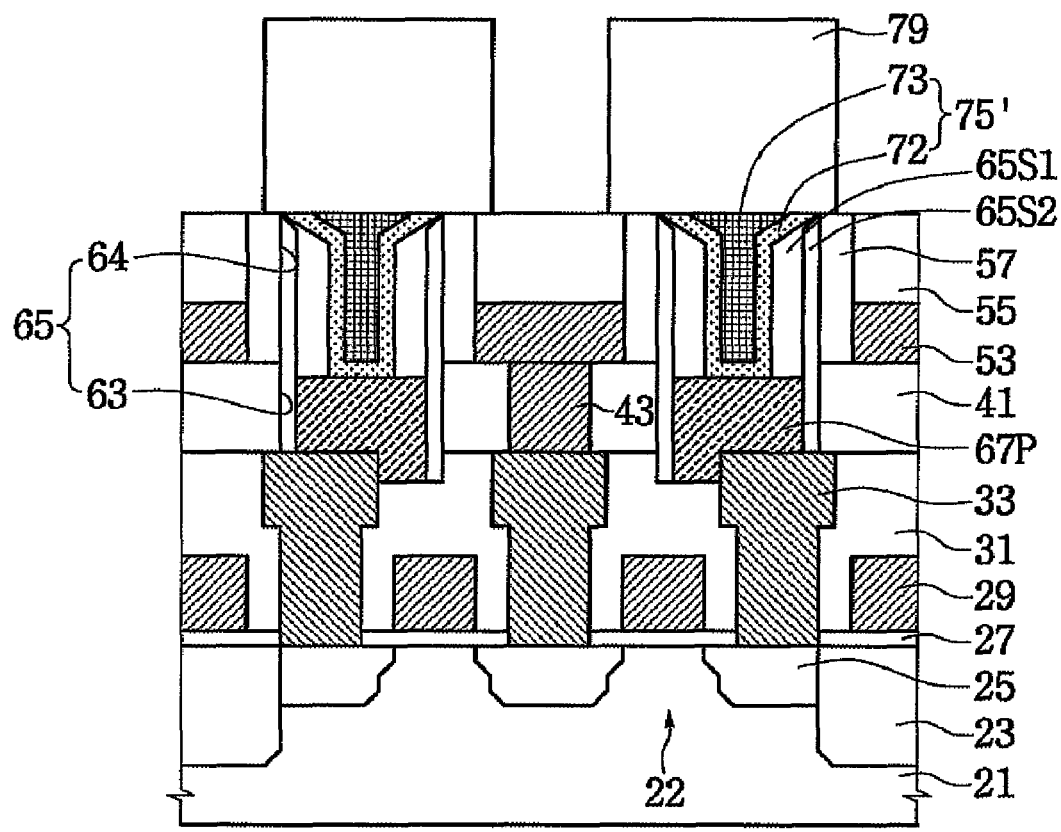
FIG. 14 is a cross-sectional view of still another semiconductor device having a contact plug, and formed in accordance with another example of the inventive concept.

FIG. 14 illustrates another semiconductor device having a contact plug which can be formed in accordance with the method described above with reference to FIGS. 12 and 13.

Referring to FIG. 14, an active region 22, an isolation layer 23, a gate dielectric layer 27, gate electrodes 29, source and drain regions 25, a lower insulating layer 31, landing pads 33, an interlayer insulating layer 41, a bit plug 43, bit lines 53, a bit capping pattern 55, bit spacers 57, and buried contact holes 65 are formed on a substrate 21 in a manner similar to that shown in and described with reference to FIGS. 1 and 2. Each of the buried contact holes 65 has an upper section 64 and a lower section 63.

First contact spacers 65S2 are formed along the sides of the buried contact holes 65 in a manner similar to that shown in FIG. 12. The first contact spacers 65S2 cover the bit spacers 57, the interlayer insulating layer 41, and the lower insulating layer 31. Also, the first contact spacers 65S2 are formed of insulating material such as silicon oxide, silicon nitride, silicon oxynitride, or a combination of respective ones of such materials.

Next, a plug pattern 67P, second contact spacers 65S1, upper plugs 75', and lower capacitor electrodes 79 are formed in a manner similar to that shown in and described with reference to FIGS. 8 and 9. The upper plugs 75' contact the plug pattern 67P and thus, the upper plugs 75' and the plug patterns 67P constitute buried contact plugs. The lower capacitor electrodes 79 are electrically connected to the source and drain regions 25 via the buried contact plugs.

Figure 15:
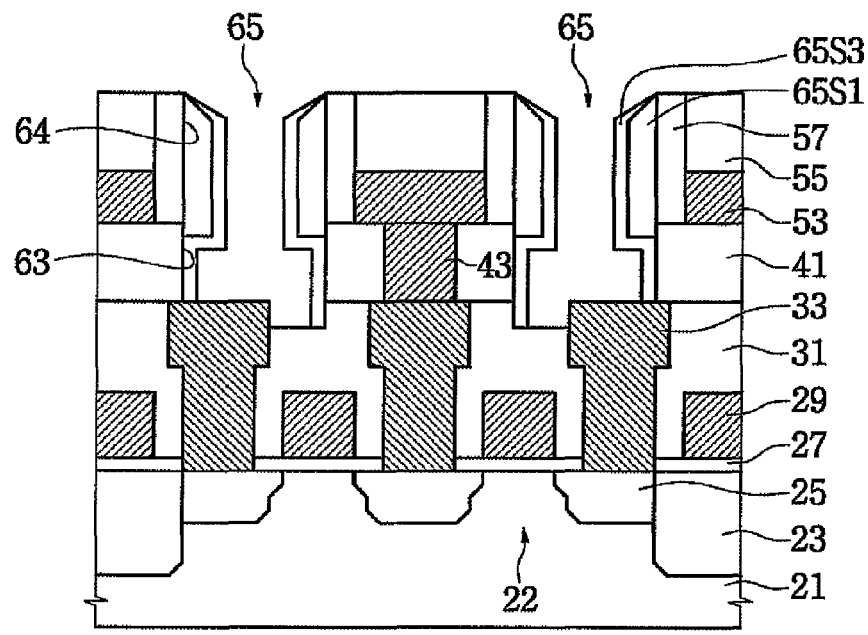
FIGS. 15 and 16 are cross-sectional views illustrating essential steps of still another example of the method of forming a semiconductor device having a contact plug in accordance with the inventive concept.
Figure 16:
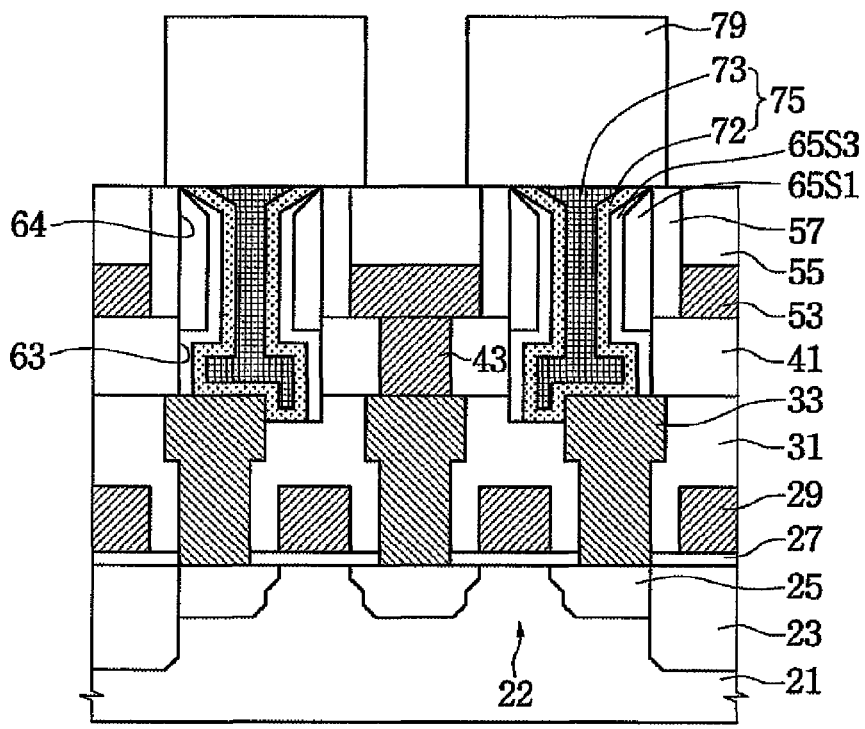

FIGS. 15 and 16 illustrate essential steps in another example of a method of forming a semiconductor device having a contact plug in accordance with the inventive concept.

Referring to FIG. 15, an active region 22, an isolation layer 23, a gate dielectric layer 27, gate electrodes 29, source and drain regions 25, a lower insulating layer 31, vias 33, an interlayer insulating layer 41, a bit plug 43, bit lines 53, bit capping patterns 55, bit spacers 57, and buried contact holes 65 are formed on a substrate 21 in a manner similar to that shown in and described with reference to FIGS. 1 and 2. Each of the buried contact holes 65 has an upper contact section 64 and a lower section 63.

Next, a plug pattern (similar to plug patter 67P shown in FIG. 3) and first contact spacers 65S1 are formed in a manner similar to that shown and described with reference to FIGS. 3 and 4. Then, the plug pattern 67P is removed to expose the pads of the vias 33, in a manner similar to that shown in and described with reference to FIG. 5.

Next, second contact spacers 65S3 are formed along the sides of the buried contact holes 65. As a result, the second contact spacers 65S3 cover the first contact spacers 65S1, the interlayer insulating layer 41, and the lower insulating layer 31. The second contact spacers 65S3 are formed of insulating material such as silicon oxide, silicon nitride, silicon oxynitride, or a combination of respective ones of such materials.

Referring to FIG. 16, buried contact plugs 75 and lower capacitor electrodes 79 are formed through in a manner similar to that shown in and described with reference to FIGS. 6 and 7. As a result, the buried contact plugs 75 contact the pads of the vias 33. Also, the lower capacitor electrodes 79 are electrically connected to the source and drain regions 25 via the buried contact plugs 75 and the vias 33.

As described above, a contact spacer is formed between a buried contact plug and an adjacent bit line. Therefore, buried contact plugs and bit lines are remarkably well insulated form each other, especially in comparison with semiconductor devices fabricated by conventional techniques. Furthermore, the buried contact plugs may be formed so as to have a relatively large width under the contact spacers. In the case in which the buried contact plugs are electrically connected to a lower conductive pattern, the contact resistance between the buried contact plugs and the lower conductive pattern is remarkably low.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of forming a semiconductor device, comprising:
    forming a lower conductive pattern on a substrate;
    covering the lower conductive pattern with an electrical insulating material;
    forming a contact hole through the insulating material at such a location as to expose the lower conductive pattern, wherein the contact hole is formed out of alignment with respect to the lower conductive pattern so as to expose a portion of an upper surface of the lower conductive pattern and a portion of a side surface of the lower conductive pattern, and wherein the contact hole has a lower section adjacent the lower conductive pattern and an upper section open at an upper surface of the insulating material;
    subsequently forming a first contact spacer of electrical insulating material on sides of the contact hole;
    forming a contact plug in the contact hole that is electrically connected to the lower conductive pattern; and
    forming an upper conductive pattern in the electrical insulating material,
    wherein the forming of the contact spacer comprises forming a spacer of electrical insulating material that extends alongside the upper conductive pattern and in self-alignment therewith such that when the contact plug is formed the contact spacer is interposed between the contact plug and the upper conductive pattern.

2. The method according to claim 1, wherein the forming of the contact spacer comprises forming a first spacer of electrical insulating material that spans the upper and lower conductive patterns.

3. The method according to claim 2, wherein the forming of the contact plug comprises forming the contact plug in contact with the bottom of the first spacer.

4. The method according to claim 1, further comprising forming a bit spacer along sidewalls of the upper conductive pattern before the contact spacer is formed, whereby when the contact spacer is formed the bit spacer is located between the contact spacer and the upper conductive pattern.

5. The method according to claim 1, wherein the upper section of the contact hole extends to at least the bottom of the upper conductive pattern, the forming of the contact spacer comprises forming a spacer of electrical insulating material along sides of only the upper section of the contact hole, and the contact plug is formed so as to be wider at the lower section of the contact hole than at the level of the upper conductive pattern.

6. A method of forming a semiconductor device, comprising:
    forming a lower conductive pattern on a substrate;
    covering the lower conductive pattern with an electrical insulating material;
    forming a contact hole through the insulating material at such a location as to expose the lower conductive pattern, wherein the contact hole has a lower section adjacent the lower conductive pattern and an upper section open at an upper surface of the insulating material;

subsequently forming a first contact spacer of electrical insulating material on sides of the contact hole;

forming a contact plug in the contact hole that is electrically connected to the lower conductive pattern; and forming an upper conductive pattern in the electrical insulating material, and wherein the forming of the contact spacer comprises forming a spacer of electrical insulating material that extends alongside the upper conductive pattern and in self-alignment therewith such that when the contact plug is formed the contact spacer is interposed between the contact plug and the upper conductive pattern, wherein the contact hole is formed out of alignment with respect to the lower conductive pattern, wherein the contact hole is formed to extend beyond the upper surface of the lower conductive pattern and thereby expose the upper surface and a side surface of the lower conductive pattern, and the contact plug is formed so as to contact the upper surface and the side surface of the lower conductive pattern.

7. The method according to claim 1, further comprising forming a second contact spacer of electrical insulating material along an upper portion only of the first contact spacer in the contact hole.

8. The method according to claim 1, wherein the forming of the first contact spacer comprises forming a spacer of electrical insulating material along the upper section only of the contact hole, and further comprising forming a second contact spacer of electrical insulating material along the first contact spacer and the lower section of the contact hole.

9. The method according to claim 1, further comprising forming, on the electrical insulating material, a data storage element electrically connected to the contact plug.

10. A method of forming a semiconductor device, comprising:
    forming a lower conductive pattern on a substrate;
    covering the lower conductive pattern with an electrical insulating material;
    forming a contact hole through the insulating material to expose the lower conductive pattern;
    forming a sacrificial pattern that occupies the bottom of the contact hole and covers the lower conductive pattern;
    forming a contact spacer of electrical insulating material along sides of the contact hole whose bottom is occupied by the sacrificial pattern;
    removing the sacrificial pattern, and exposing the lower conductive pattern; and
    forming a contact plug in the contact hole, in contact with the lower conductive pattern.

11. The method according to claim 10, wherein the sacrificial pattern is formed of material having an etch selectivity with respect to the contact spacer, the insulating material, and the lower conductive pattern.

12. The method according to claim 10, wherein the sacrificial pattern is formed of a carbon spin on organic hard mask.

13. The method according to claim 10, further comprising forming an upper conductive pattern in the electrical insulating material, and wherein the forming of the contact spacer comprises forming a spacer of electrical insulating material that extends alongside the upper conductive pattern and in self-alignment therewith such that when the contact plug is formed the contact spacer is interposed between the contact plug and the upper conductive pattern.

14. The method according to claim 13, wherein the contact hole is formed out of alignment with respect to the lower conductive pattern.

15. The method according to claim 13, wherein the contact hole is formed to extend beyond the upper surface of the lower conductive pattern and thereby expose the upper surface and a side surface of the lower conductive pattern, and the contact plug is formed so as to contact the upper surface and the side surface of the lower conductive pattern.

16. A method of forming a semiconductor device, comprising:
    forming a lower conductive pattern on a substrate;
    covering the lower conductive pattern with an electrical insulating material;
    forming a contact hole through the insulating material to expose the lower conductive pattern, wherein the contact hole is formed out of alignment with respect to the lower conductive pattern so as to expose a portion of an upper surface of the lower conductive pattern and a portion of a side surface of the lower conductive pattern;
    forming a plug pattern that occupies the bottom of the contact hole and covers the lower conductive pattern;
    forming a spacer of electrical insulating material along sides of the contact hole whose bottom is occupied by the plug pattern; and
    forming a plug on the plug pattern.

17. The method according to claim 16, wherein the plug pattern is a layer of material selected from the group consisting of an SiGe layer, an Si layer, an AlN layer, a metal silicide layer, and a metal layer, or is of a combination of respective materials selected from the group consisting of SiGe, Si, AlN, metal silicides, and metals.

18. The method according to claim 16, wherein the forming of the plug comprises depositing a barrier metal layer and a metal layer sequentially on the substrate, wherein the barrier metal layer is of material selected from the group consisting of Ti and TiN, and the metal layer is of a composition different from that of the barrier metal layer and is selected from the group consisting of W, WN, Ti, TiN, Ta, TaN, AlN, TiAlN, TaAlN, and Cu.

* * * * *